(12) United States Patent
Jones, III et al.

(10) Patent No.: US 11,728,336 B2
(45) Date of Patent: Aug. 15, 2023

(54) COMPENSATED ALTERNATING POLARITY CAPACITIVE STRUCTURES

(71) Applicant: NXP USA, Inc., Austin, TX (US)

(72) Inventors: Robert S. Jones, III, Austin, TX (US); Xiankun Jin, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/941,729

(22) Filed: Jul. 29, 2020

(65) Prior Publication Data

US 2020/0357794 A1 Nov. 12, 2020

Related U.S. Application Data

(62) Division of application No. 16/181,790, filed on Nov. 6, 2018, now Pat. No. 10,770,457.

(51) Int. Cl.
*H01L 27/08* (2006.01)
*H01L 23/532* (2006.01)
*H01L 23/522* (2006.01)
*H03M 1/00* (2006.01)
*H01L 49/02* (2006.01)

(52) U.S. Cl.
CPC ...... *H01L 27/0805* (2013.01); *H01L 23/5223* (2013.01); *H01L 23/53204* (2013.01); *H01L 28/60* (2013.01); *H01L 28/87* (2013.01); *H03M 1/00* (2013.01)

(58) Field of Classification Search
CPC ........... H01L 23/5223; H01L 28/86–88; H01L 27/0805
See application file for complete search history.

(56) References Cited

U.S. PATENT DOCUMENTS

| | | | | | |
|---|---|---|---|---|---|
| 5,583,359 | A | * | 12/1996 | Ng | H01L 23/5223 257/306 |
| 5,939,766 | A | * | 8/1999 | Stolmeijer | H01L 23/5223 257/307 |
| 6,066,537 | A | * | 5/2000 | Poh | H01L 23/5223 438/251 |
| 7,990,676 | B2 | * | 8/2011 | Topaloglu | H01L 23/5222 361/313 |
| 2010/0079317 | A1 | * | 4/2010 | Feddeler | H03M 1/1038 341/120 |

OTHER PUBLICATIONS

IXYS datasheet for NCD2400M (Year: 2018).*

(Continued)

*Primary Examiner* — Vincent Wall

(57) ABSTRACT

Embodiments are provided for a capacitive array including: a first row of alternating first fingers and second fingers formed in a first conductive layer, wherein each first and second finger has a uniform width in a first direction and a uniform length in a second direction perpendicular to the first direction, the first row of alternating first and second fingers include a same integer number of first fingers and second fingers, and the first and second fingers are interdigitated in the first direction; and a first compensation finger formed in the first conductive layer at an end of the first row of alternating first and second fingers nearest a first outer boundary of the capacitive array, the first compensation finger configured to have an opposite polarity as a neighboring finger on the end of the first row.

10 Claims, 5 Drawing Sheets

(56) References Cited

OTHER PUBLICATIONS

Sendi et al., "General Structure for Base-m Capacitive Digital to Analog Converter", 2015 23rd Iranian Conference on Electrical Engineering (ICEE), IEEE. (Year: 2015).*
Lee et al., "Design of a 10-bit SAR ADC with Enhancement of Linerarity on C-DAC Array", IDEC Journal of Intergrated Circuits and Systems, vol. 02, No. 1, Apr. 2016, pp. 64-69 (Year: 2016).*
Zhu et al., "Split-SAR ADCs: Improved Linearity with Power and Speed Optimzation", IEEE Transactions on Very Large Scale Integration (VLSI) Systems, vol. 22, No. 2, Feb. 2014, pp. 372-383 (Year: 2014).*

* cited by examiner

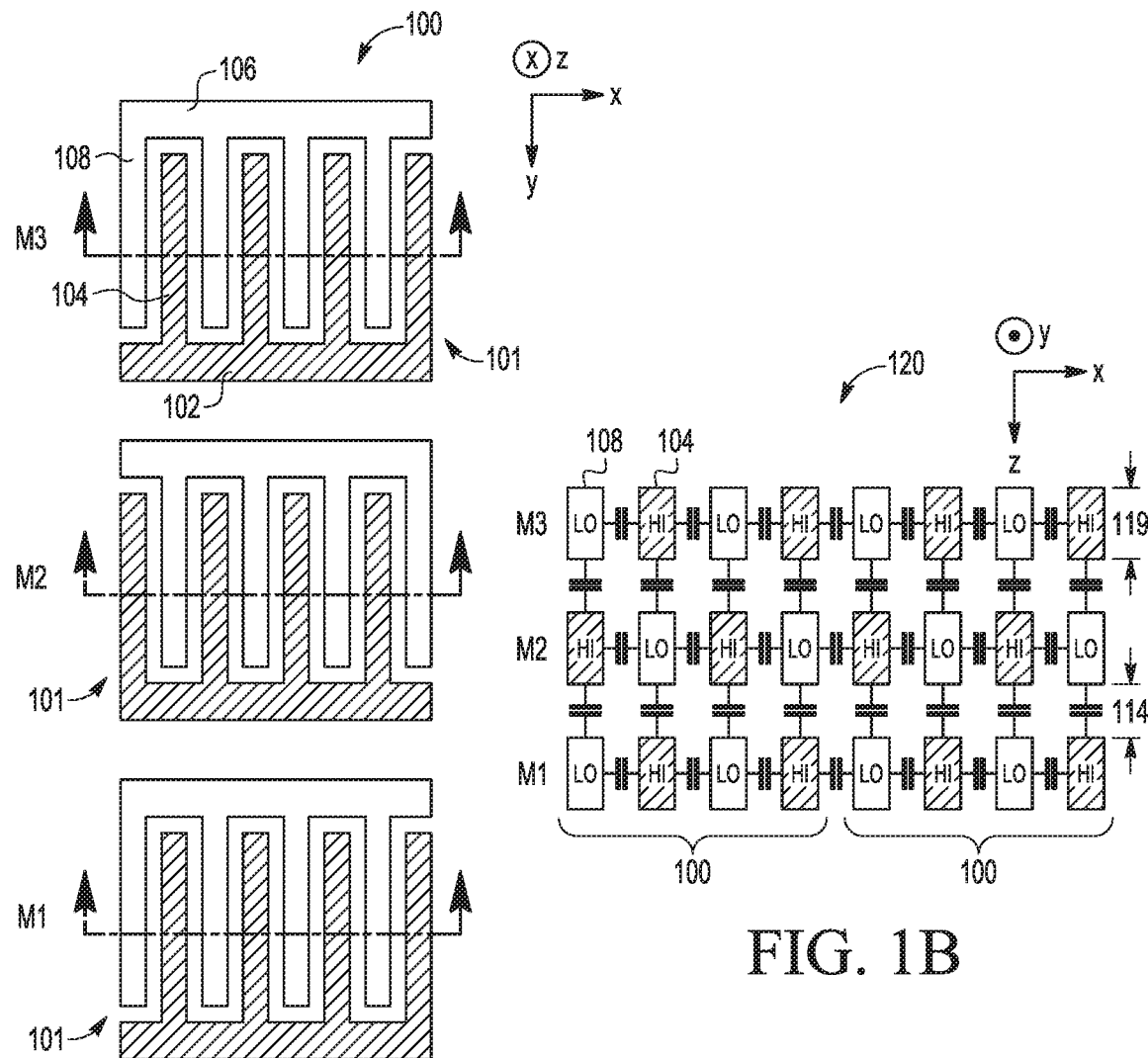
FIG. 1A
FIG. 1B
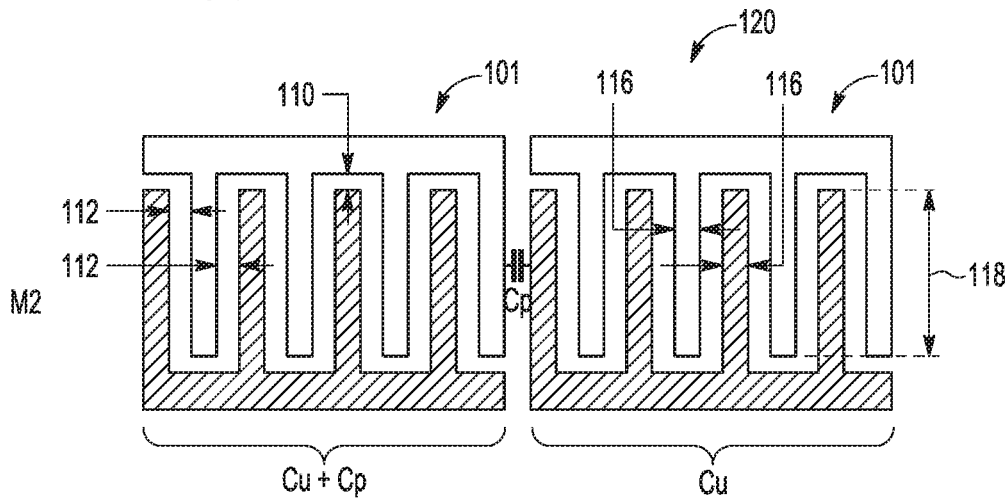
FIG. 1C

COMPENSATED ALTERNATING POLARITY CAPACITIVE STRUCTURES

RELATED INVENTION

This application is a Divisional of co-pending U.S. patent application Ser. No. 16/181,790, filed on 6 Nov. 2018.

BACKGROUND

Field

This disclosure relates generally to integrated circuits, and more specifically, to alternating polarity capacitive arrays including compensated capacitive structures.

Related Art

Capacitors are extensively used in integrated circuits, such as in a capacitive digital-to-analog converter (CDAC). Conventionally, a capacitor is formed by two conductive elements separated by dielectric material. Depending on the number of capacitors needed by a circuit, multiple capacitors may be formed in an array of capacitors. High density capacitor arrays are generally desired for CDAC design in order to reduce the layout size of the CDAC.

BRIEF DESCRIPTION OF THE DRAWINGS

The present invention may be better understood, and its numerous objects, features, and advantages made apparent to those skilled in the art by referencing the accompanying drawings.

FIGS. 1A, 1B, and 1C are block diagrams depicting different views of example multi-level capacitive structures implemented in an array of multi-level capacitive structures, according to some embodiments of the present disclosure.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

Figure 2A:
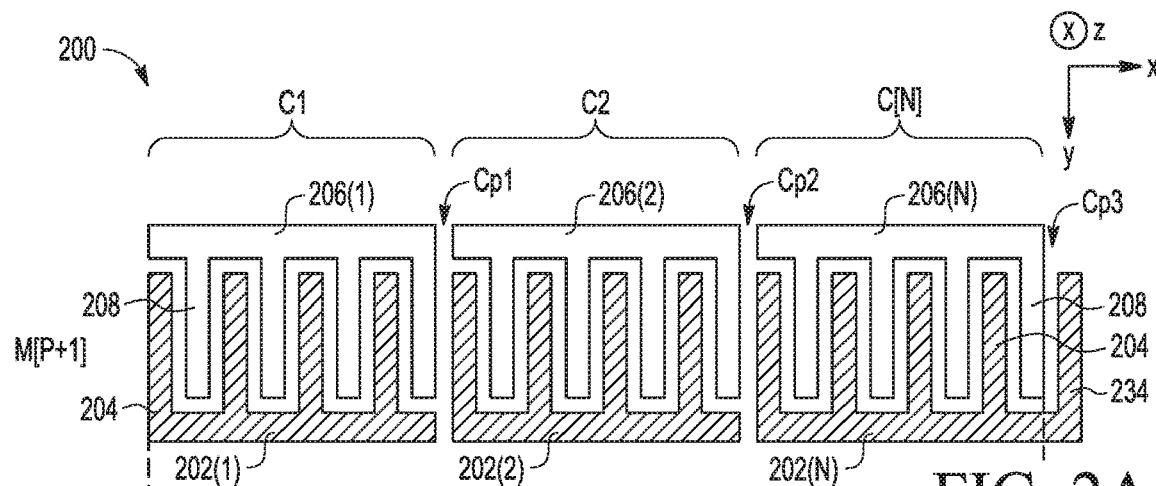
FIGS. 2A, 2B, 2C, and 2D are block diagrams depicting different views of an example multi-level capacitive array, according to some embodiments of the present disclosure.

The following sets forth a detailed description of various embodiments intended to be illustrative of the invention and should not be taken to be limiting.
Overview In order to achieve a large density of capacitors in an integrated circuit, a capacitor may be formed using interdigitated capacitive plates or "fingers," which may also be referred to as a fringe capacitor. A conventional fringe capacitor includes at least a first set of fingers vertically stacked over a second set of fingers, where the first and second sets include a same number of fingers. The fingers are separated in the horizontal (e.g., x-axis) and vertical (e.g., z-axis) directions by dielectric material. Fringe capacitors may be non-alternating or alternating polarity capacitors. In a non-alternating polarity fringe capacitor, the polarities of the fingers only alternate in a horizontal direction (e.g., every other finger in a horizontal row has a same polarity, while every finger stacked in a vertical column has the same polarity), forming capacitance in the horizontal direction between fingers. In an alternating polarity fringe capacitor, the polarities of the fingers alternate in both a horizontal direction and a vertical direction of the array (e.g., every other finger in a horizontal row and every other finger in a vertical column has a same polarity). Generally, alternating polarity fringe capacitors provide higher capacitive density than non-alternating polarity fringe capacitors, due to the additional capacitance in the vertical direction between fingers. The higher capacitive density should make a fringe capacitor a good candidate for reducing a footprint of a circuit that requires a large number of capacitors, such as in capacitive digital-to-analog converter (CDAC) design, which is often used in analog-to-digital converter (ADC) design, especially in successive approximation register ADC (SAR ADC) design. However, placing conventional fringe capacitors side-by-side in an array often results in large linearity errors that occur from capacitance mismatch at the edges of the array and parasitic capacitance between fringe capacitors, making them unsuitable for use in applications that require good linearity, such as in CDAC design.

The present disclosure provides for an alternating polarity capacitive array that includes compensation fingers, which are extra fingers added at specific locations at the edges of the array to compensate capacitance mismatch and improve linearity of the array. The capacitive array may be formed using an alternating polarity fringe capacitor as a base or unit capacitor, where multiple unit capacitors are formed side-by-side in a row from a first end of the array to an opposite second end of the array in a first direction (e.g., the row extends in the x-direction). Additional rows of unit capacitors may also be formed in the first direction, where the rows of unit capacitors are laterally adjacent to one another (e.g., each row is laterally separated from another row in the y-direction). The unit capacitors include a unit capacitive structure at one or more levels in a vertical direction (e.g., the levels are stacked in the z-direction), where each unit capacitive structure includes a set of interdigitated fingers. Since the unit capacitors are formed side-by-side in each row, the fingers of each unit capacitive structure at a given level also form a row of interdigitated fingers from the first end of the array to the second end of the array.

A compensation finger may be formed next to an end of a given row of interdigitated fingers that is nearest one of the first or second end of the array. Another compensation finger may be formed next to an end of a vertically adjacent row of interdigitated fingers that is nearest the other of the first or second end of the array. In other words, a compensation finger may be included at an alternating end of the array as one passes down (or up) through the levels of the array (e.g., a first compensation finger is formed at a first level nearest a first end of the array, a second compensation finger is formed at a vertically adjacent second level nearest the second end of the array, a third compensation finger is formed at a next vertically adjacent third level nearest the first end of the array, and so on). Each compensation finger may be connected to either a positive or a negative electrode of a neighboring unit capacitive structure, resulting in a compensated capacitive structure. In this manner, each compensated capacitive structure at the end of a row includes one more finger than the unit capacitive structures in the remainder of the row.

In some embodiments, the capacitive array may be implemented in a CDAC. In such embodiments, the capacitive array may be split into three segments that form a least significant bit (LSB) segment, an intermediate significant bit (ISB) segment, and a most significant bit (MSB) segment, with scaling capacitors electrically connected between the segments. In some embodiments, a spacing distance, a shielding structure, or both may be implemented between the array segments and the scaling capacitors to minimize unwanted parasitic capacitance. In some embodiments, additional shielding structures may be implemented above, below, or both above and below the fingers of the capacitive array to further minimize unwanted parasitic capacitance. In embodiments where the array includes two or more rows of unit capacitors, each row is split into three row segments that respectively correspond to the LSB, ISB, and MSB segments. Within each of the LSB, ISB, and MSB segments, the unit capacitors in the corresponding row segments may be cross-connected according to a dispersed connection pattern (e.g., interconnecting a first unit capacitor in a first row segment and a second unit capacitor in a laterally adjacent second row segment) for improved capacitance matching.

Example Embodiments

FIGS. 1A, 1B, and 1C show different views of example capacitive structures that may be used to implement an alternating polarity capacitive array according to the present disclosure. An example multi-level capacitive structure 100 is shown in FIG. 1A, which may be used as a base or standard structure for an array. In the embodiment shown, multi-level capacitive structure 100 includes three levels that correspond to respective conductive layers M1, M2, and M3 on a semiconductor substrate, such as an integrated circuit die formed as part of a semiconductor wafer. In other embodiments, multi-level capacitive structure 100 may include fewer than three levels (e.g., 1 or 2 levels) or more than three levels (e.g., 4 or 8 levels). As shown in the respective planar views of FIG. 1A, each level of structure 100 includes a unit capacitive structure 101 (also referred to as a unit structure 101 or a standard unit structure), which are vertically stacked over one another as shown in the cross-sectional view of FIG. 1B. Each multi-level capacitive structure 100 forms a unit capacitor 100, and may be placed side-by-side to form a row of unit capacitors in an array 120, a portion of which is shown in FIGS. 1B and 1C.

Each unit structure 101 includes a first set of fingers 104 (also referred to as first fingers 104) that are interdigitated or placed in alternating order with a second set of fingers 108 (also referred to as second fingers 108), forming a row of alternating first and second fingers in a horizontal direction (labeled as the x-direction in the top right corner of FIG. 1A). In the embodiments discussed herein, the first set of fingers 104 includes a same integer N number of fingers as the second set of fingers 108, with N being equal to or greater than 1. In the embodiment shown, each of the first and second sets includes 4 fingers, but other integer numbers may be used in other embodiments (e.g., 1, 3, 8). The first fingers 104 are electrically connected to a first electrode 102, which extends in the x-direction to directly contact each of the first fingers 104, which may also be described as parallel first fingers 104 extending in a perpendicular y-direction from electrode 102. Similarly, the second fingers 108 are electrically connected to a second electrode 106, which extends in the x-direction to directly contact each of the second fingers 108, which may also be described as parallel second fingers 108 extending in a perpendicular y-direction from electrode 106.

Additional detail of a unit structure 101 is shown in the planar view of FIG. 1C, where each of the first fingers 104 and the second fingers 108 have a uniform width 116 measured in the first direction (e.g., x-direction), and have a uniform length 118 measured in a second direction perpendicular to the first direction (e.g., y-direction), where length 118 is generally larger than width 116. The fingers 104 and 108 are separated from one another by a uniform horizontal spacing or gap 112 that is also measured in the first direction. The fingers 104 and 108 are also respectively separated from opposite electrodes 106 and 102 by a second uniform horizontal spacing or gap 110, which may be equal to gap 112 in some embodiments. The gaps 112 and 110 between the fingers and the electrodes are filled with dielectric material, examples of which may include but are not limited to silicon oxide, silicon nitride, silicon dioxide, silicon oxynitride, polyimide, other suitable materials including oxides, nitrides, and the like. As shown in the cross-sectional view of FIG. 1B, the fingers 104 and 108 are also equally spaced in the horizontal direction by gap 112, even between unit structures 101, to produce uniformly spaced rows of alternating first and second fingers at each level across the array. The cross-sectional view of FIG. 1B also shows that the fingers of different levels are separated by a uniform vertical spacing or gap 114 that is measured in a third direction orthogonal to the first and second directions (e.g., z-direction), which is also filled with dielectric material. In some embodiments, vertical gap 114 may be equal to gap 112. The fingers 104 and 108 also have a uniform thickness 119, based on the thickness of the conductive material used in layers M1, M2, and M3. It is noted that the fingers and electrodes in a given level are formed from a same layer of conductive material, where the electrodes 102 and 106 may also have a same thickness 119 as the fingers 104 and 108. The conductive material utilized in conductive layers M1, M2, and M3 may be a metal, examples of which may include but are not limited to copper, gold, aluminum, or other suitable conductive material or alloy composed of one of more suitable metals (e.g., barrier layers such as titanium nitride or tantalum nitride), to form a metal-oxide-metal (MOM) capacitor array, or may be polysilicon (e.g., doped polysilicon) or other suitable silicon alloy (e.g. titanium silicide) to form a polysilicon-oxide-polysilicon (POP) capacitor array.

In the embodiment shown in FIG. 1B, fingers 104 and 108 are arranged in both horizontal rows and vertical columns, where fingers 104 and 108 alternate in both the horizontal and vertical directions. For example, a first finger 104 in the array may have a neighboring (or laterally adjacent in the x-direction) second finger 108 on the right side, on the left side, or on both sides. A first finger 104 may also have a vertically adjacent second finger 108 aligned above, aligned below, or both above and below the first finger. Each first electrode 102 is configured to electrically connect first fingers 104 to a first voltage potential (e.g., a positive voltage such as a supply voltage Vdd or other suitable voltage signal), and each second electrode 106 is configured to electrically connect second fingers 108 to a second voltage potential (e.g., ground or negative voltage such as supply voltage Vss or other suitable voltage signal). Charge of a first polarity builds up on first fingers 104 and an equal charge with opposite polarity builds up on second fingers 108, where the alternating first and second fingers 104 and 108 may also be referred to as having alternating polarity, in both horizontal and vertical directions. The capacitance or charge that the fingers are able to store is generally based on the separation or gap between each pair of adjacent fingers and the uniform plate area or finger surface area facing the gap, where the dielectric material between the fingers has a substantially uniform permittivity E suitable for high density capacitors. It is noted that a number of process variations may occur during fabrication of the capacitive structures, which may affect the uniformity of the thicknesses of the conductive material and dielectric material, as well as the uniformity of the widths and lengths of each of the fingers, and the uniformity of the gap distances between fingers and between fingers and opposing electrodes, all of which may ultimately affect the linearity of the capacitance stored by the fingers in the array. Such variation may be further compensated for using capacitance matching, as further discussed below in connection with FIG. 5.

In the example shown, first fingers 104 act as positive polarity capacitor plates (labeled as "HI" in FIG. 1B with cross-hatching) and second fingers 108 act as negative polarity capacitor plates (labeled as "LO" in FIG. 1B as white), where each pair of adjacent fingers stores charge, both in a horizontal direction (based on left and right finger surface area) and in a vertical direction (based on top and bottom finger surface area), which is represented as capacitor symbols drawn between finger pairs. In this manner, an array built with multi-level structures 100 that implement alternating polarity is capable of providing a greater capacitance density, or larger capacitance value per unit area, as compared with an array built with non-alternating polarity structures. The polarity of the fingers may be reversed in other embodiments.

FIG. 1C shows a planar view of the unit capacitive structures 101 at an M2 level of two multi-level capacitive structures 100 placed side-by-side as a portion of an array 120 without compensation fingers (which are further discussed below). When a single unit capacitance structure 101 of FIG. 1A is viewed alone, it can be seen that the 8 interdigitated fingers of structure 101 together store some unit capacitance Cu. When placed side-by-side, the close proximity of the right structure 101 to the left structure 101 (by the uniform gap 112) induces a parasitic capacitance Cp in the left structure 101, resulting in the left structure 101 having a larger total capacitance of Cu+Cp, while the right structure 101 has a smaller total capacitance of Cu. This unequal capacitance can be seen at the end of each row at different levels of the array 120, where a unit capacitance structure 101 nearest an end of a row may have a different capacitance as compared with structures 101 located within that row. The unequal capacitance at each level is exacerbated when the unit structures 101 are aggregated to form unit capacitors. For example, when viewing FIG. 1B as a standalone array of two multi-level capacitive structures 100, the left structure 100 has a total capacitance equal to 3Cu+Cp (or the unit capacitance for each unit structure 101 plus parasitic capacitance at the M2 level) and the right structure 100 has a total capacitance equal to 3Cu+2Cp (or the unit capacitance for each unit structure 101 plus parasitic capacitance at the M3 and M1 level). If not compensated, this unequal capacitance negatively affects linearity of the unit capacitors implemented in an array.

Figure 2B:
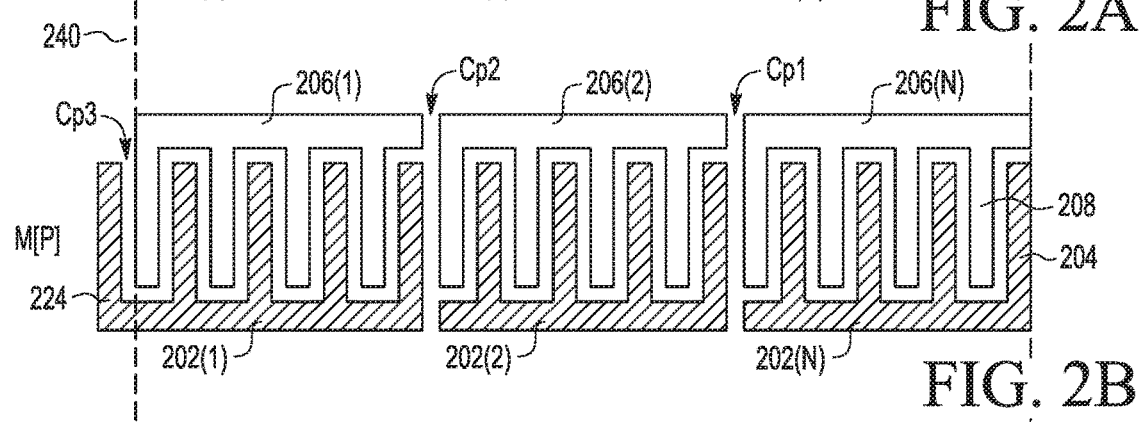
Figure 2C:
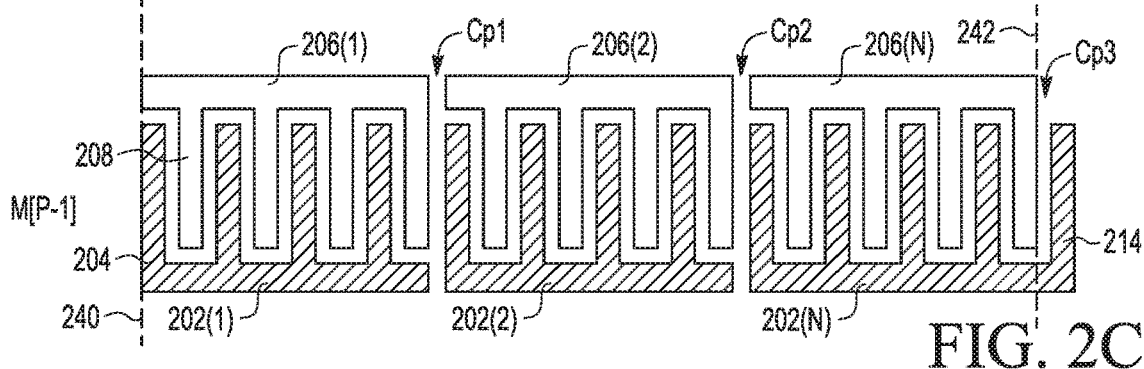
Figure 2D:
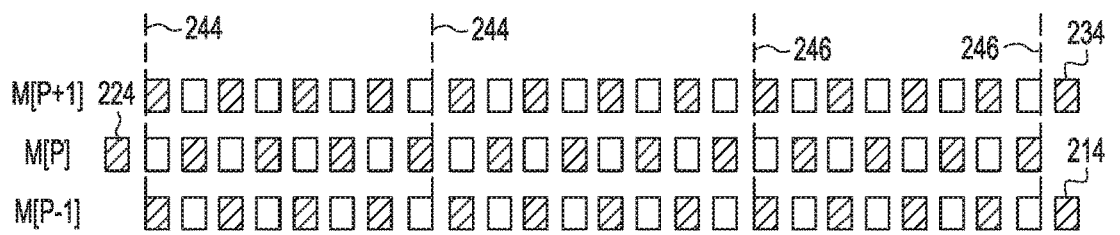

FIG. 2A-2D show views of an example multi-level capacitive array 200 using multi-level capacitance structures (as similarly described above) and compensation fingers. FIGS. 2A, 2B, and 2C each shows a planar view of a respective level in array 200, which correspond to sequential conductive layers M[P−1], M[P], and M[P+1] that are vertically adjacent, although additional or fewer levels may be implemented in other embodiments. FIG. 2D shows a corresponding cross-sectional view of the levels in array 200.

Each level includes a row of an integer N number of unit structures, N being equal to one or more, where each (standard) unit structure includes a set of first fingers 204 interdigitated or alternated with a set of second fingers 208. The set of first fingers 204 may be electrically connected to a first electrode 202 and the set of second fingers 208 may be electrically connected to a second electrode 206, which respectively correspond to fingers 104 and 108 and electrodes 102 and 106 of a standard unit structure 101 described above. The unit structures are placed side-by-side from one end or outer boundary 240 of the array (shown as a dashed line on the left side of FIGS. 2A, 2B, and 2C) to an opposite end or outer boundary 242 of the array (shown as a dashed line on the right side of FIGS. 2A, 2B, and 2C). The unit structures are placed such that the interdigitated fingers of each unit structure together form a row of interdigitated fingers (or a row of alternating first and second fingers) at each level, which extends in a horizontal direction (e.g., x-direction as shown in top right of FIG. 2A) between array boundary 240 and array boundary 242. The fingers of the rows of interdigitated fingers are vertically stacked such that each finger in one level is vertically aligned with a finger in a vertically adjacent level (e.g., fingers are arranged in a row by column formation).

The multiple stacked rows of interdigitated fingers implement a row of unit capacitors C[1]-[N], where each unit capacitor is formed from several unit structures that are vertically stacked. Since the unit structures are placed side-by-side at each level, a parasitic capacitance is induced between adjacent unit structures. For example, viewing unit structures at level M[P+1] in FIG. 2A, a first parasitic capacitance Cp1 is induced in C1's unit structure by neighboring C2's unit structure (e.g., the closest adjacent positive polarity finger 204 of C2's unit structure induces Cp1), and a second parasitic capacitance Cp2 is similarly induced in C2's unit structure by neighboring CN's unit structure. Since CN's unit structure does not have a neighboring unit structure, additional parasitic capacitance Cp3 is intentionally induced in CN's unit structure by including compensation finger 234 at the end of the row of interdigitated fingers next to CN's unit structure, which is nearest array boundary 242. The intentionally induced parasitic capacitance (e.g., Cp3) is substantially equal to parasitic capacitances (e.g., Cp1 and Cp2) induced by side-by-side unit structure placement, resulting in a substantially equal parasitic capacitance associated with each unit structure.

In some embodiments, compensation finger (e.g., fingers 234, 224, 214) has a same width, length, and thickness as the uniform width 116, length 118, and thickness 119 as the other first and second fingers 204 and 208 in the array. In some embodiments, compensation finger is also spaced apart from the neighboring finger on the end of the row of interdigitated fingers by the uniform gap 112. The polarity of compensation finger is opposite the neighboring finger on the end of the row, where the compensation finger is electrically connected to the electrode that is also opposite the polarity of the neighboring finger. For example, compensation finger 234 is at a first polarity (shown with cross-hatching) that is opposite the polarity of the neighboring finger at the end of the M[P+1] row (shown in white) closest to array boundary 242 (on the right side of the array), where the compensation finger 234 is electrically connected to electrode 202(N), which also has the first polarity opposite the polarity of the neighboring finger. Electrode 202(N) extends further in the x-direction (as compared to an electrode 202 of a standard unit structure) to directly contact compensation finger 234. The unit structure that further includes a compensation finger electrically connected to one of its electrodes may also be referred to as a compensated capacitive structure or simply a compensated structure. A compensated structure may be easily identified as having one more finger than the other standard unit structures in a row of unit structures.

When viewing unit structures at level M[P] in FIG. 2B, it is noted that the unit structure layout of level M[P] (e.g., the order of fingers in the row) is reversed compared to the unit structure layout at M[P+1], in order to alternate first and second fingers 204 and 208 in both the horizontal direction (e.g., x-direction) and vertical direction (e.g., z-direction), which is also shown in the cross-sectional view of FIG. 2D, with directions labeled in the lower right corner. As shown in FIG. 2B, Cp1 is induced in CN's unit structure by neighboring C2's unit structure, and Cp2 is induced in C2's unit structure by neighboring C1's unit structure. To induce Cp3 in C1's unit structure, compensation finger 224 is implemented at the end of the row of interdigitated fingers next to C1's unit structure, which is nearest array boundary 240. Compensation finger 224 is electrically connected to electrode 202(1) at level M[P], forming a compensated structure at the left end of the M[P] row. Similarly, when viewing unit structures at level M[P−1] in FIG. 2C, the unit structure layout of M[P−1] is reversed compared to the vertically adjacent level M[P] to continue alternating fingers in the horizontal and vertical directions. Cp3 is induced in CN's unit structure by implementing compensation finger 214 at the end of the row of interdigitated fingers next to CN's unit structure, which is nearest array boundary 242. Compensation finger 214 is electrically connected to electrode 202(N) at level M[P−1], forming a compensated structure at the right end of the M[P−1] row.

As shown in FIG. 2D, compensation fingers are placed at alternating ends of the array 200, as one travels down (or up) the vertically adjacent levels in the array 200. Since each unit structure at each level is associated with a same parasitic capacitance, each unit capacitor is associated with a same overall unit capacitance, greatly enhancing the linearity of the array 200. In the row of unit capacitors of array 200, a first unit capacitor C1 nearest a first array boundary 240 (e.g. at one end of the row of unit capacitors) and a last unit capacitor CN nearest an opposite second array boundary 242 (e.g., at an opposite end of the row of unit capacitors) respectively includes one or more compensation fingers. First unit capacitor C1 includes the stacked unit structures within footprint 244, and further includes one or more compensation fingers formed nearest array boundary 240, such as compensation finger 224 on level M[P]. Similarly, last unit capacitor CN includes the stacked boundary 242, such as compensation finger 214 on level M[P−1] and compensation finger 234 on level M[P+1].

It is also noted that the layout used to implement the row of unit capacitors C1-CN in array 200 (including compensation fingers) may be repeated to implement multiple rows of unit capacitors in the x-direction and having multiple levels in the z-direction, where the rows of unit capacitors are laterally separated from one another in the perpendicular or y-direction.

Figure 3A:
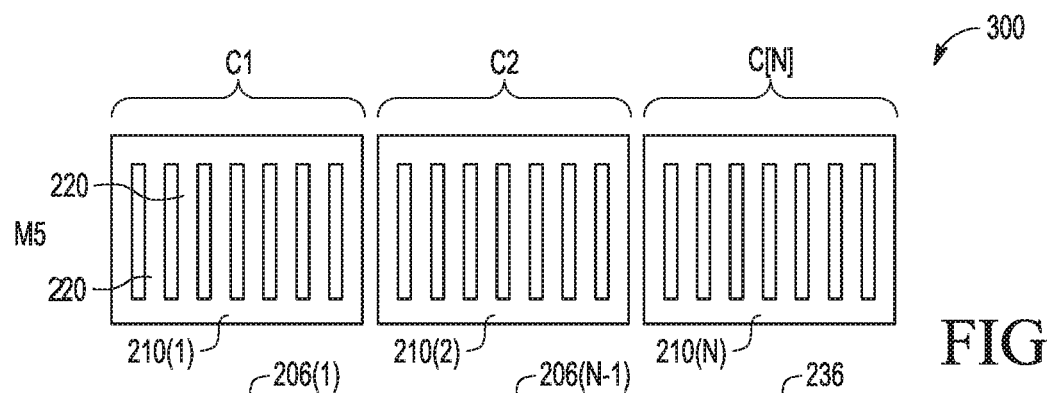
FIGS. 3A, 3B, 3C, 3D, 3E, and 3F are block diagrams depicting different views of another example multi-level capacitive array, according to some embodiments of the present disclosure.
Figure 3B:
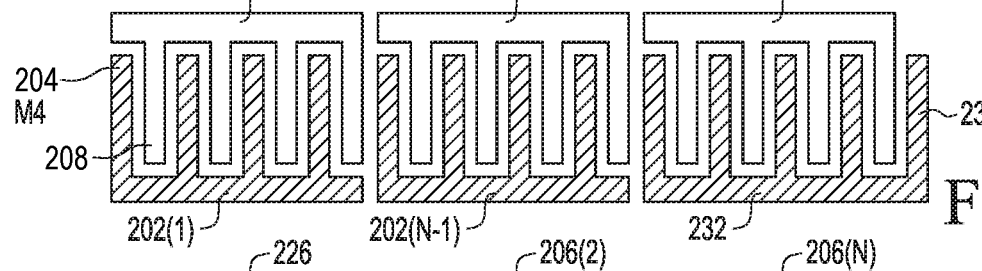
Figure 3C:
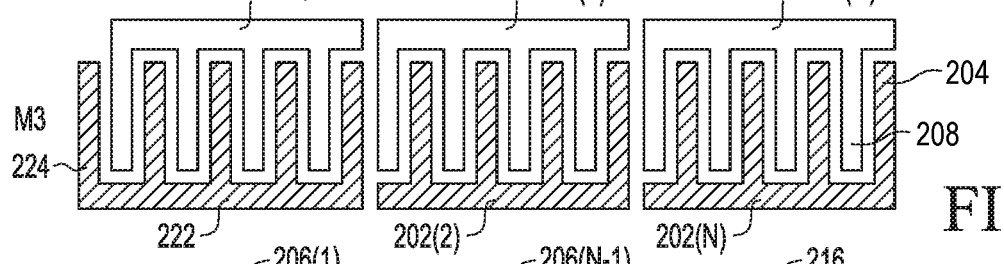
Figure 3D:
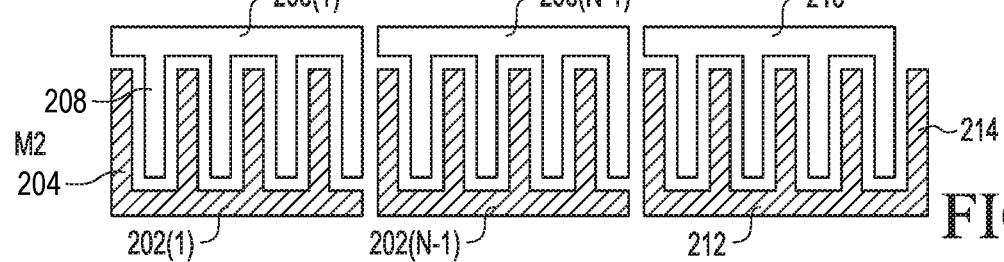
Figure 3E:
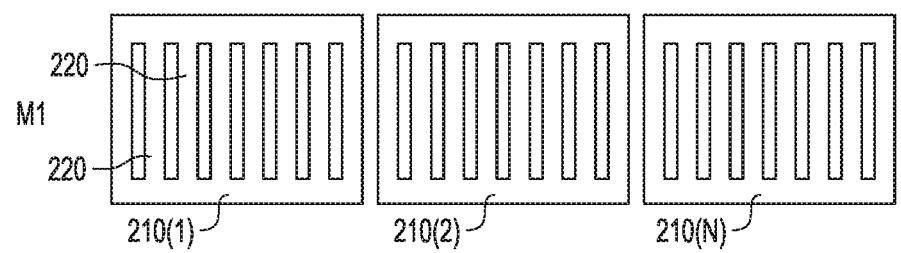
Figure 3F:
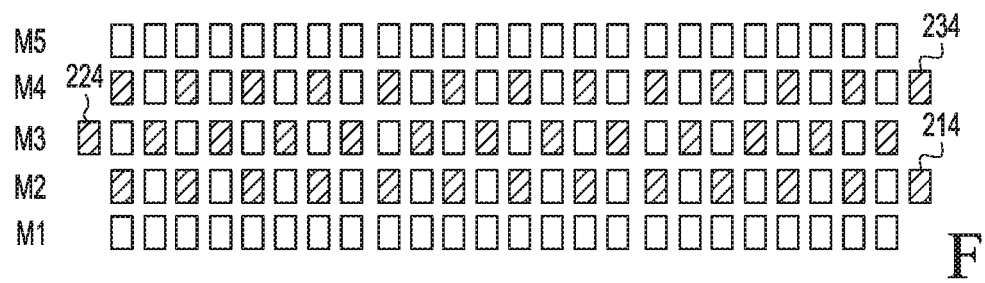

FIG. 3A-3F show views of an example multi-level capacitive array 300 using multi-level capacitance structures and compensation fingers (as similarly described above). FIGS. 3A, 3B, 3C, 3D, and 3E each shows a planar view of a respective level in array 300, which correspond to sequential conductive layers M1, M2, M3, M4, and M5 that are vertically adjacent, although additional or fewer levels may be implemented in other embodiments. FIG. 3F shows a corresponding cross-sectional view of the levels in array 300.

Array 300 is similarly implemented by a plurality of (standard) unit structures and compensation fingers, which implement a row of unit capacitors C1-CN. In FIG. 3B, a compensated structure is shown at the right end of the row at level M4, which is implemented by the combination of structure 232 and structure 236. Structure 232 includes an electrode 202, first fingers 204, and compensation finger 234. Structure 236 includes an electrode 206 and second fingers 208. In FIG. 3C, another compensated structure is shown at the left end of the row at level M3, formed by the combination of structures 222 (including compensation finger 224) and 226. In FIG. 3D, another compensated structure is shown at the right end of the row at level M2, formed by the combination of structures 212 (including compensation finger 214) and 216.

It is also noted that the layout used to implement the row of unit capacitors C1-CN in array 300 (including compensation fingers) may be repeated to implement multiple rows of unit capacitors in the x-direction and having multiple levels in the z-direction, where the rows of unit capacitors are laterally separated from one another in the perpendicular or y-direction.

Array 300 further includes shielding structures 210, which may be formed in a conductive layer above the rows of unit structures (such as layer M5, shown in FIG. 3A), in a conductive layer below the rows of unit structures (such as layer M1, shown in FIG. 3E), or in both a conductive layer above and a conductive layer below the rows. A shielding structure 210 is similar to a unit structure, but with all fingers connected to both electrodes. Each shielding structure 210 includes a number of fingers 220 equal to a total number of fingers in a unit structure. For example, each unit structure includes 4 first fingers 204 and 4 second fingers 208, which corresponds to a total of 8 fingers 220. A row of shielding structures 210 is formed in the same horizontal direction as the rows of unit structures, where each finger 220 is vertically aligned with a corresponding finger in a vertically adjacent unit structure. Each shielding structure 210 is electrically connected to the second voltage potential (e.g., ground or negative voltage such as supply voltage Vss or other suitable voltage signal) to minimize any additional unwanted parasitic capacitance around the top-most and bottom-most layers of the array 300. The cross-sectional view in FIG. 3F show the fingers 220 in a top-most layer M5, vertically adjacent to the first and second fingers in the M4 row, and in a bottom-most layer M1, vertically adjacent to the first and second fingers in the M2 row.

Figure 4:
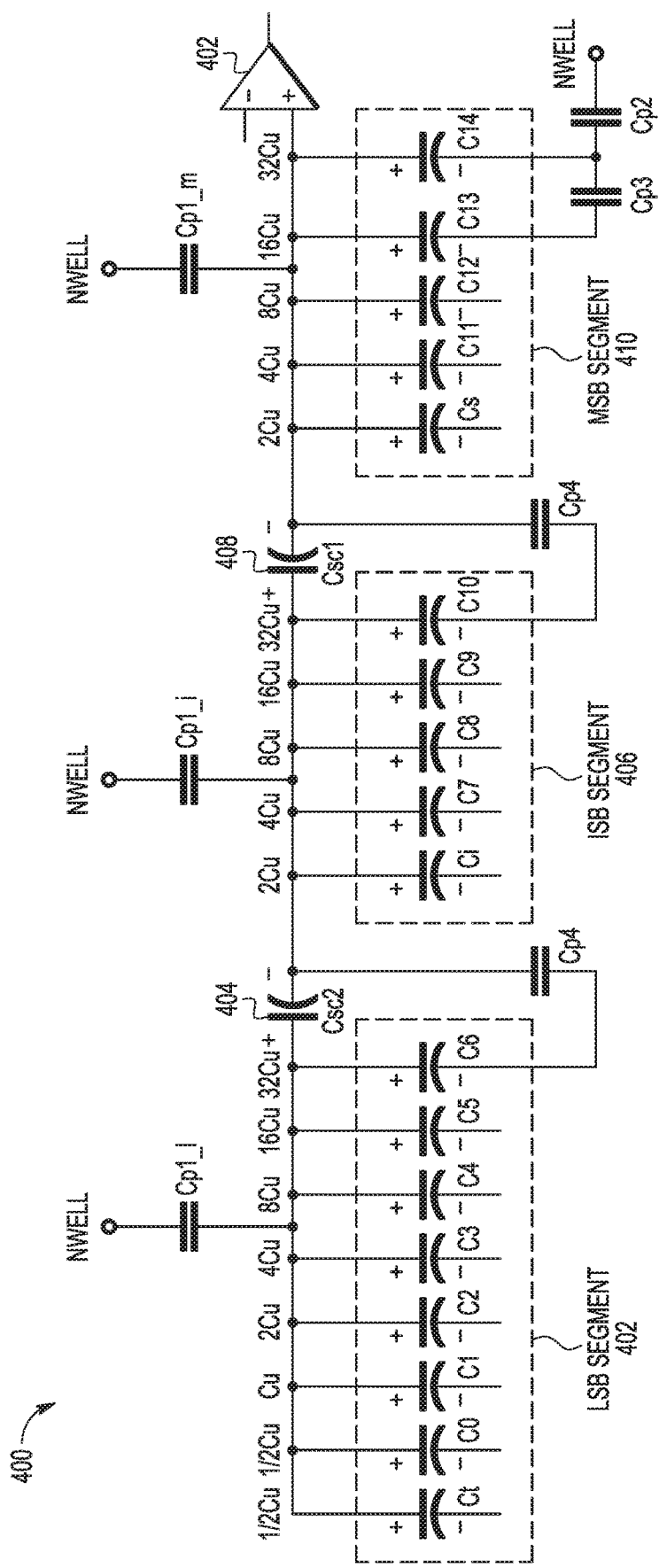
FIG. 4 illustrates a schematic diagram of a capacitive digital-to-analog converter (CDAC) that implements a split multi-level capacitive array, according to some embodiments of the present disclosure.

FIG. 4 illustrates a schematic diagram of a capacitive digital-to-analog converter (CDAC) 400 that implements a split multi-level capacitive array. CDAC 400 may be used as part of an analog-to-digital converter (ADC), such as a successive approximation register ADC (SAR ADC) that effectively implements a binary search algorithm to determine an M-bit binary value that corresponds to an analog input voltage VIN, M being an integer greater than 1. CDAC 400 includes a comparator 402 having one input coupled to a capacitive array, and another input coupled to a reference voltage VREF (not shown). In the embodiment shown, the capacitive array is coupled to the non-inverting (+) input of the comparator 402, and the reference voltage is coupled to the inverting (−) input of the comparator 402. The capacitive array implements an M number of binary weighted capacitors, each capacitor corresponding to a binary digit (or bit), and one or more auxiliary capacitors. The bottom plate of each binary weighted capacitor and auxiliary capacitor in the array may be connected by a respective switching circuit (not shown) to one of a number of voltages, such as a high voltage VH, a low voltage VL, and the analog input voltage VIN, where VL VIN VH. In a SAR ADC embodiment, the SAR control logic controls each switching circuit.

During a sampling phase of the binary search algorithm, SAR control logic controls the capacitive array to sample the analog input voltage VIN, where all bottom plates of the capacitors are connected to VIN during the sampling phase. After the sampling phase, the bottom plate of C14 (corresponding to the most significant bit of the binary value) is connected to VH for the (next) comparing phase of the binary search algorithm. During the comparing phase, the comparator 402 compares the voltages at its inputs (such as VREF and the voltage sampled by the array, including one or more binary weighted capacitors connected to VH) and provides a binary output that corresponds to the comparison. The binary output indicates a present bit of the binary value (e.g., 0 or 1), which SAR control logic uses to control the bottom plate of a present capacitor (such as C14) to be connected to the voltage VH or VL that corresponds to the binary output. SAR control logic then controls the bottom plate of the next binary weighted capacitor (such as C13) to be connected to VH and the sampling and comparing process repeats to determine the next bit. This process iterates until the analog input voltage VIN is converted into the M-bit binary value.

The capacitive array used for CDAC 400 is similar to those arrays discussed above (such as array 200 or array 300) that use alternating polarity multi-level capacitive structures and compensation fingers, which provide good linearity. In the embodiment shown, attenuating or scaling capacitors Csc1 and Csc2 are included to split the capacitive array into three array segments: a least significant bit (LSB) segment 402, an intermediate significant bit (ISB) segment 406, and a most significant bit (MSB) segment 410. Such an array may also be referred to as a two-split array. Splitting the array allows the use of smaller capacitors while still maintaining the binary or close to binary relationship between adjacent capacitors. Typically, all capacitors in the same array segments will be placed together for better capacitance matching and die size reduction. Scaling capacitor Csc1 is electrically connected between MSB segment 410 and ISB segment 406, and scaling capacitor Csc2 is electrically connected between ISB segment 406 and LSB segment 402. Since scaling capacitor Csc1 shares a common positive node with capacitors in the ISB segment 406, Csc1 may be included in or grouped into the ISB segment 406. Similarly, scaling capacitor Csc2 shares a common positive node with capacitors in the LSB segment 402, and may be included in or grouped into the LSB segment 402. However, due to the alternating polarity of the capacitors in the array, an unwanted parasitic capacitance is induced when Csc1 is placed next to C10 and when Csc2 is placed next to C6.

In the embodiment shown, the inclusion of scaling capacitor Csc1 induces parasitic capacitance Cp4 between the bottom plate of Csc1 (which is connected to the common positive node of MSB segment 410) and the bottom plates of the capacitors in ISB segment 406, represented by Cp4 connected between the negative plates of C10 and Csc1. The inclusion of scaling capacitors Csc2 also induces parasitic capacitance Cp4 between the bottom plate of Csc1 (which is connected to the common positive node of ISB segment 406) and the bottom plates of the capacitors in LSB segment 402, represented by Cp4 connected between the negative plates of C6 and Csc2. Parasitic capacitance Cp4 changes the capacitance seen from the bottom plate of C6 and C10, which essentially changes the capacitor ratio that results in linearity error of this design.

There may also be parasitic capacitance between the common positive nodes of capacitors in the LSB segment 402, ISB segment 406, and MSB segment 410, and the surrounding n-type well (labeled NWELL) on the substrate in which the array is formed, respectively labeled as Cp1_l, Cp1_i, and Cp1_m, which is also referred to as top plate parasitic capacitance. There may also be parasitic capacitance between the bottom plates of the capacitors in the array (which may be connected to a positive voltage like VH) and the n-type well (labeled NWELL), represented by Cp2 connected between the negative plate of C14 and NWELL. Similarly, there may also be parasitic capacitance between the bottom plates of the capacitors in the array, various ones of which may be connected to a positive voltage like VH, represented by Cp3 connected between the negative plates of C13 and C14. The parasitic capacitances Cp1, Cp2, and Cp3 in FIG. 4 have little impact on capacitance matching. However, since Cp4 affects linearity of the capacitive array, the present disclosure provides an approach for minimizing Cp4 below, described in connection with FIG. 5.

As noted above, the capacitive array implements an M number of binary weighted capacitors, each capacitor corresponding to a binary digit (or bit), and one or more auxiliary capacitors. Since the capacitive array is built with unit capacitors (or multi-level capacitive structures), the unit capacitors can be connected in combination (e.g., connected in parallel) to form the larger binary weighted capacitors and the auxiliary capacitors, together referred to as CDAC capacitors. The number of CDAC capacitors and the size of the CDAC capacitors depends on the resolution requirements of CDAC 400. For example, for a 15-bit binary value, LSB segment 402 implements capacitors C0 through C6 and an auxiliary capacitor Ct, ISB segment 406 implements capacitors C7 through C10 and another auxiliary capacitor Ci, and MSB segment 410 implements capacitors C11 through C14 and another auxiliary capacitor Cs. For the 15-bit embodiment, the CDAC capacitors in each array segment are implemented by a binary weighted multiple of unit capacitors Cu, which is noted above each CDAC capacitor in FIG. 4. For example in the LSB segment 402, capacitor C6 is implemented with 32 unit capacitors, labeled as 32Cu. The adjacent capacitor C5 is implemented with half as many (or 16) unit capacitors, labeled as 16Cu. A similar binary relationship can be seen for capacitors C10 and C9 in the ISB segment 406, and capacitors C14 and C13 in MSB segment 410. The CDAC capacitors and their corresponding number of unit capacitors used to implement the CDAC capacitors are provided below in Table 1.

TABLE 1

| CDAC capacitors | | | | | |
|---|---|---|---|---|---|
| LSB segment 402 | | ISB segment 406 | | MSB segment 410 | |
| C6 | 32Cu | C10 | 32Cu | C14 | 32Cu |
| C5 | 16Cu | C9 | 16Cu | C13 | 16Cu |
| C4 | 8Cu | C8 | 8Cu | C12 | 8Cu |
| C3 | 4Cu | C7 | 4Cu | C11 | 4Cu |
| C2 | 2Cu | Ci | 2Cu | Cs | 2Cu |

TABLE 1-continued

| CDAC capacitors | | |
|---|---|---|
| LSB segment 402 | ISB segment 406 | MSB segment 410 |
| C1 | Cu | |
| C0 | Cu/2 | |
| Ct | Cu/2 | |

Figure 5:
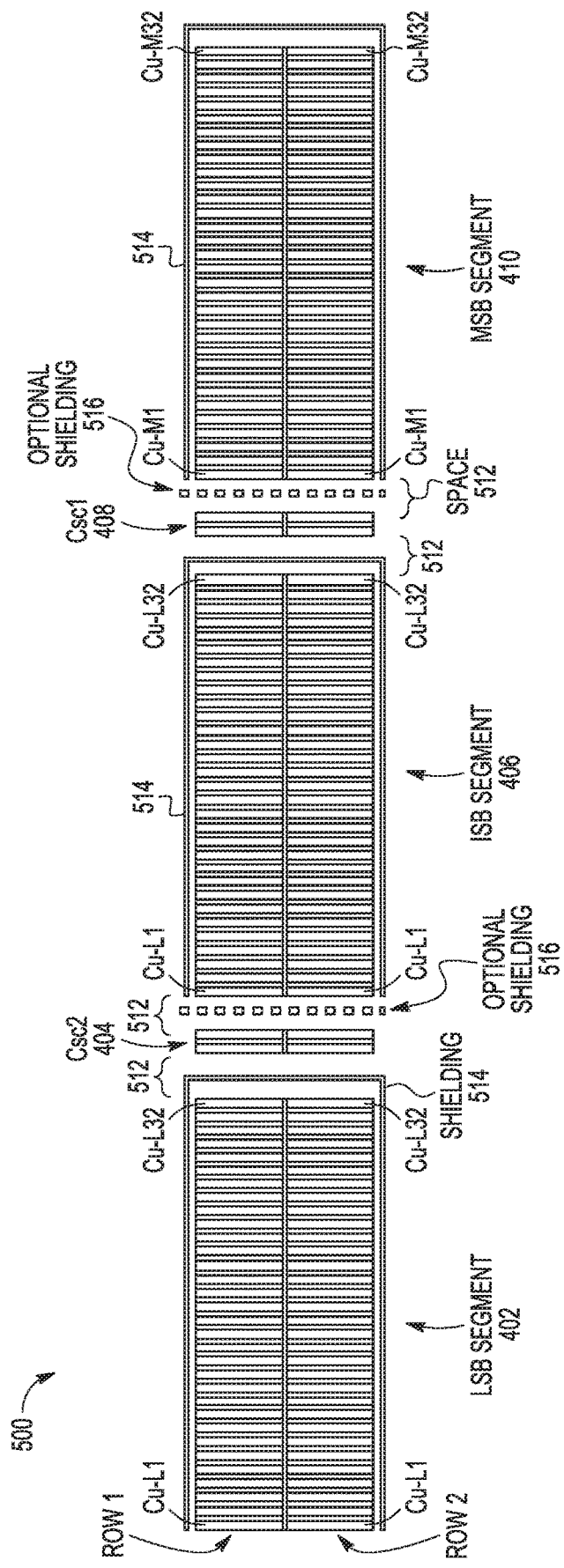
FIG. 5 illustrates a top-down view of a split multi-level capacitive array implemented in an integrated circuit as part of a CDAC, according to some embodiments.

FIG. 5 illustrates a top-down view of a split multi-level capacitive array implemented in an integrated circuit as part of a CDAC like that shown in FIG. 4. The split multi-level capacitive array (or simply capacitive array) is formed using multi-level capacitive structures as unit capacitors, as discussed above. The capacitive array is divided into three array segments: LSB segment 402, ISB segment 406, and MSB segment 410. The layout of the unit capacitors within the capacitive array is further discussed below.

In order to reduce unwanted parasitic capacitance (e.g., Cp4) between scaling capacitors Csc1 and Csc2 and their respective associated LSB and ISB segment, a lateral spacing 512 is introduced. Csc1 and Csc2 are laterally separated from the LSB, ISB, and MSB segments by the spacing 512, which is larger than horizontal spacing or gap 112 (e.g., the horizontal gap in the x-direction between fingers in the array). A shielding structure 514 is also introduced to reduce parasitic capacitance (e.g., Cp4). Since Csc1 shares a common positive node with ISB segment 406, a shielding structure 514 is implemented adjacent to the ISB segment 406 in the spacing 512 between Csc1 and ISB segment 406. Shielding structure 514 is formed from conductive material and is electrically connected to ground. In the embodiment shown, shielding structure 514 also wraps around ISB segment 406, which may be helpful to reduce other parasitic capacitance between the capacitors in the ISB segment and the surrounding n-type well. Similarly, a shielding structure 514 is implemented adjacent to the LSB segment in the spacing 512 between Csc2 and LSB segment 402. In the embodiment shown, shielding structure 514 wraps around LSB segment. For the sake of design efficiency, a shielding structure 514 may also be included in a similar location adjacent to MSB segment (e.g., the shielding structure 514 may be positioned adjacent to the right side of each array segment by a same offset distance) in order to reuse a design layout or photolithographic masks to implement the capacitive array. In the embodiment shown, the shielding structure 514 may also wrap around the MSB segment. Optional shielding structures 516 may also be implemented in the spacing 512 between Csc1 and MSB segment 410, as well as in the spacing 512 between Csc2 and ISB segment 406, which is illustrated with a broken line in FIG. 5. Similarly, the optional shielding structures 516 may be positioned adjacent to the left side of ISB and MSB segments by the same offset distance as the shielding structures 514, which may be equal to approximately half of the spacing 512 in some embodiments.

As shown in FIG. 5, the capacitive array is split into three array segments that are laterally separated from one another. Since the capacitive array implements one or more rows of unit capacitors (as noted above in connection with FIGS. 2 and 3 series), splitting the capacitive array into three array segments is accomplished by splitting each row of unit capacitors into three row segments. In the embodiment shown, capacitive array includes two rows of unit capacitors, labeled Row1 (or the upper row with respect to FIG. 5) and Row2 (or the lower row with respect to FIG. 5). Row1 and Row2 have each been split into three row segments, each row segment corresponding to the LSB segment, the ISB segment, and the MSB segment. In the embodiment shown, each row segment includes a same number of unit capacitors. In other embodiments, the row segments associated with a same array segment include a same number of unit capacitors, where the number of unit capacitors per row segment may differ for each array segment. For example, the row segments associated with the MSB segment may include a different number of unit capacitors as the row segments associated with the LSB segment. In the embodiment shown, each row segment implements 32 unit capacitors, giving a total of 64 unit capacitors within each array segment.

The row segments generally extend in the x-direction and are laterally separated from one another in the y-direction. Two rows are implemented in the capacitive array in order to minimize top plate parasitic capacitance, as well as minimize layout routing to connect the unit capacitors to form the larger CDAC capacitors. While some embodiments may simply connect adjacent unit capacitors to implement the CDAC capacitors (which are also shown as being adjacent in the CDAC 400 of FIG. 4), process variations that may occur during fabrication of the capacitive array may ultimately affect the uniformity of the unit capacitors. Such process variations may affect the uniformity of the thicknesses of the conductive material and dielectric material used to form the capacitive array, as well as the uniformity of the widths and lengths of each of the fingers, and the uniformity of the gap distances between fingers and between fingers and opposing electrodes, all of which may ultimately affect the linearity of the capacitance stored by the unit capacitors. For example, a unit capacitor at the left end of Row 1 of the array may have a different capacitance compared with a unit capacitor at the same left end of Row 2 of the array.

In order to compensate for such variations, it is beneficial to implement capacitor matching by connecting the unit capacitors within an array segment using a dispersed connection pattern to form the larger CDAC capacitors. By connecting unit capacitors that are at dispersed locations within an array segment, capacitance variations of the unit capacitors may be averaged out. While the unit capacitors may be connected in a variety of different patterns, the dispersed connection patterns discussed herein implement connections across the row segments within an array segment (also referred to as cross-connecting unit capacitors). Further, the dispersed connection patterns minimize the number of capacitors that are (directly) laterally adjacent to one another in the x-direction, achieving a maximum dispersion of the unit capacitors across the row segments to form the CDAC capacitors. For example, CDAC capacitor C14 may be implemented by connecting 32 unit capacitors in parallel (e.g., connecting the positive plates or fingers of the 32 unit capacitors to a common positive node and the negative plates or fingers to a common negative node), with 16 of those unit capacitors located in the Row1 segment of MSB segment 410 and 16 of those unit capacitors located in the Row 2 segment of MSB segment 410, with as few of those unit capacitors being neighboring unit capacitors as possible. Example dispersed connection patterns for connecting unit capacitors in the row segments associated with LSB segment, ISB segment, and MSB segment are respectively provided below in Tables 2, 3, and 4.

TABLE 2

MSB dispersed connection pattern

| | |
|---|---|
| MSB segment 410 | CAADABACABABAEABACADABACABABAEAB ABEABABACABADACABAEABABACABADACA |
| | A: One of the 32Cu to construct C14. B: One of the 16Cu to construct C13. C: One of the 8Cu to construct C12. D: One of the 4Cu to construct C11. E: One of the 4Cu to construct Cs. |

TABLE 3

ISB dispersed connection pattern

| | |
|---|---|
| ISB segment 406 | EBACABABACABADAAACABABACABADABA BADABACABABACAAADABACABABACABAE |
| | A: One of the 32Cu to construct C10. B: One of the 16Cu to construct C9. C: One of the 8Cu to construct C8. D: One of the 4Cu to construct C7. E: One of the 2Cu to construct Ci. |

TABLE 4

LSB dispersed connection pattern

| | |
|---|---|
| LSB segment 402 | ACADABACABABAEABACADABACABABAFAB BAFABABACABADACABAEABABACABADACA |
| | A: One of the 32Cu to construct C6. B: One of the 16Cu to construct C5. C: One of the 8Cu to construct C4. D: One of the 4Cu to construct C3. E: One of the 2Cu to construct C2. F: One of the 2Cu to construct C1, C0 and Ct. |

By now it should be appreciated that there has been provided an alternating polarity capacitive array that implements one or more rows of unit capacitors and includes compensation fingers placed at specific locations at the edges of the array to compensate capacitance mismatch and improve linearity of the array. The capacitive array may be split into three array segments, with scaling capacitors electrically connected between the array segments, where the scaling capacitors are laterally spaced from the array segments in order to minimize parasitic capacitance. Linearity of the array may be further improved by including shielding structures on one or both sides of the scaling capacitors, and by including additional shielding structures above, below, or both above and below the array, or any combination thereof. The unit capacitors implemented in the array may be connected across row segments in a dispersed connection pattern, which averages out any variations in the unit capacitors for improved capacitance matching.

In one embodiment of the present disclosure, an integrated circuit is provided, which includes: a capacitive array including: a first row of alternating first fingers and second fingers formed in a first conductive layer, wherein each first and second finger has a uniform width in a first direction and a uniform length in a second direction perpendicular to the first direction, the first row of alternating first and second fingers include a same integer number of first fingers and second fingers, and the first and second fingers are interdigitated in the first direction; and a first compensation finger formed in the first conductive layer at an end of the first row of alternating first and second fingers nearest a first outer boundary of the capacitive array, the first compensation finger configured to have an opposite polarity as a neighboring finger on the end of the first row.

One aspect of the above embodiment provides that the capacitive array further includes: a second row of alternating first and second fingers formed in a second conductive layer that is vertically adjacent to the first conductive layer, wherein each first finger in the second row is vertically aligned with a second finger in the first row, and each second finger in the second row is vertically aligned with a first finger in the first row, and a second compensation finger formed in the second conductive layer at an end of the second row nearest a second outer boundary of the capacitive array opposite the first outer boundary, the second compensation finger configured to have an opposite polarity as a second neighboring finger on the end of the second row.

A further aspect of the above embodiment provides that the second conductive layer is below the first conductive layer, and the second row is vertically aligned under the first row.

Another further aspect of the above embodiment provides that the second conductive layer is above the first conductive layer, and the second row is vertically aligned over the first row.

Another aspect of the above embodiment provides that the first and second fingers are separated from one another by a uniform spacing, and the first compensation finger also has the uniform width and the uniform length, and is separated from the neighboring finger by the uniform spacing.

Another aspect of the above embodiment provides that the first fingers are configured to have a positive polarity, the second fingers are configured to have a negative polarity, the first compensation finger is an extra first finger, and each second finger is located between a pair of first fingers.

Another further aspect of the above embodiment provides that the first row of alternating first and second fingers implements a first plurality of unit capacitive structures in the first conductive layer, and the second row of alternating first and second fingers implements a second plurality of unit capacitive structures in the second conductive layer, wherein each unit capacitive structure includes a subset of first fingers interdigitated with a subset of second fingers, the subset of first fingers connected by a first electrode and the subset of second fingers connected by a second electrode.

A still further aspect of the above embodiment provides that a first unit capacitive structure implemented in the first conductive layer nearest the first outer boundary of the capacitive array further includes the first compensation finger connected to one of the first and second electrodes, and a second unit capacitive structure in the second conductive layer nearest the second outer boundary further includes the second compensation finger connected to one of the first and second electrodes.

Another still further aspect of the above embodiment provides that each vertically aligned stack of two or more unit capacitive structures in the capacitive array forms a multi-level capacitive structure, and each multi-level capacitive structure in the capacitive array is associated with a same amount of parasitic capacitance.

One aspect of the above embodiment provides that the capacitive array is implemented in a capacitive digital-to-analog converter (CDAC), and the capacitive array is split into three segments: a first segment of the capacitive array configured to implement a most significant bit (MSB) segment, a second segment of the capacitive array configured to implement an intermediate significant bit (ISB) segment, and a third segment of the capacitive array configured to implement a least significant bit (LSB) segment, and the capacitive array further includes: a first scaling capacitive structure electrically connected between the LSB segment and the ISB segment, and a second scaling capacitive structure electrically connected between the ISB segment and the MSB segment.

A further aspect of the above embodiment provides that the capacitive array further includes: a first lateral separation formed between the LSB segment and the first scaling capacitive structure, a second lateral separation formed between the first scaling capacitive structure and the ISB segment, a third lateral separation formed between the ISB segment and the second scaling capacitive structure, and a fourth lateral separation formed between the second scaling capacitive structure and the MSB segment.

Another further aspect of the above embodiment provides that the capacitive array further includes: a first shielding structure formed between the LSB segment and the first scaling capacitive structure, and a second shielding structure formed between the ISB segment and the second scaling capacitive structure.

Another further aspect of the above embodiment provides that the first row of alternating first and second fingers implements a first plurality of unit capacitive structures in the first conductive layer, and the capacitive array further includes a second row of alternating first and second fingers in the first conductive layer, wherein the second row is laterally adjacent to the first row, the second row of alternating first and second fingers implements a second plurality of unit capacitive structures in the first conductive layer, and each unit capacitive structure in the first conductive layer is part of a respective unit capacitor.

A still further aspect of the above embodiment provides that the first plurality of unit capacitive structures are part of a first row of unit capacitors, the second plurality of unit capacitive structures are part of a second row of unit capacitors, and each of the MSB, ISB, and LSB segments includes a corresponding first row segment of the first row of unit capacitors and a corresponding second row segment of the second row of unit capacitors.

A yet still further aspect of the above embodiment provides that the unit capacitors of the MSB segment are interconnected across the corresponding first and second row segments in a first dispersed connection pattern to form a first set of CDAC capacitors, the unit capacitors of the ISB segment are interconnected across the corresponding first and second row segments in a second dispersed connection pattern to form a second set of CDAC capacitors, and the unit capacitors of the LSB segment are interconnected across the corresponding first and second row segments in a third dispersed connection pattern to form a third set of CDAC capacitors.

Another further still aspect of the above embodiment provides that each CDAC capacitor is implemented by a respective subset of unit capacitors that includes at least one unit capacitor located in the corresponding first row segment and at least one unit capacitor located in the corresponding second row segment.

Another further still aspect of the above embodiment provides that each unit capacitor includes a multi-level capacitive structure, each multi-level capacitive structure includes a unit capacitive structure in the first conductive layer and one or more unit capacitive structures at a respective one or more conductive layers vertically adjacent to the first conductive layer, and each multi-level capacitive structure implements a uniform unit capacitance.

Another aspect of the above embodiment provides that the capacitive array includes an alternating polarity metal-oxide-metal (MOM) capacitive array.

Another aspect of the above embodiment provides that the capacitive array includes an alternating polarity polysilicon-oxide-polysilicon (POP) capacitive array.

Another aspect of the above embodiment provides that the integrated circuit further includes: a plurality of shielding structures formed either in a conductive layer underneath the capacitive array, in a conductive layer above the capacitive array, or in both conductive layers above and below the capacitive array, wherein the shielding structures each having a plurality of shielding fingers, each shielding finger vertically aligned with a respective finger in the first row.

The substrate described herein may be a semiconductor substrate, such as an integrated circuit die formed as part of a semiconductor wafer (also referred to as simply wafer), which may include any semiconductor material or combinations of materials, such as gallium arsenide, silicon germanium, silicon-on-insulator (SOI), silicon, monocrystalline silicon, the like, and combinations of the above. The active circuitry for the integrated circuit die on semiconductor wafer, including the multi-level capacitive structures, is formed using a sequence of numerous process steps applied to semiconductor wafer, including but not limited to depositing semiconductor materials including dielectric materials and conductive materials, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. Examples of integrated circuit components include but are not limited to a processor, memory, logic, analog circuitry, sensor, MEMS (microelectromechanical systems) device, a standalone discrete device such as a resistor, inductor, capacitor, diode, power transistor, and the like. In some embodiments, the active circuitry may be a combination of the integrated circuit components listed above or may be another type of microelectronic device.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

The following description refers to nodes or features being "connected" or "coupled" together. As used herein, unless expressly stated otherwise, "coupled" means that one node or feature is directly or indirectly joined to (or is in direct or indirect communication with) another node or feature, and not necessarily physically. As used herein, unless expressly stated otherwise, "connected" means that one node or feature is directly joined to (or is in direct communication with) another node of feature. For example, a switch may be "coupled to a plurality of nodes, but all of those nodes need not always be "connected" to each other; the switch may connect different nodes to each other depending upon the state of the switch. Furthermore, although the various schematics shown herein depict certain example arrangements of elements, additional intervening elements, devices, features, or components may be present in an actual embodiment (assuming that the functionality of the given circuit is not adversely affected).

It is noted that the term "neighboring" as used herein means "adjacent to" (e.g., next to and without an intervening object), and "laterally" as used herein means "in a sideways direction" (e.g., a horizontal direction that is parallel to a plane of the substrate). Additionally, the terms "substantial" and "substantially" mean sufficient to achieve the stated purpose or value in a practical manner, taking into account any minor imperfections or deviations, if any, that arise from usual and expected process abnormalities that may occur during wafer fabrication, which are not significant for the stated purpose or value.

Although the invention is described herein with reference to specific embodiments, various modifications and changes can be made without departing from the scope of the present invention as set forth in the claims below. For example, additional or fewer multi-level capacitive structures may be implemented in the arrays shown in the FIGS. 2 and 3 series. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A capacitive array structure embedded in a capacitive digital-to-analog converter (CDAC) comprising:

a first row of alternating first fingers and second fingers formed in a first conductive layer, wherein each first and second finger has a uniform width in a first direction and a uniform length in a second direction perpendicular to the first direction, the first row of alternating first and second fingers include a same integer number of first fingers and second fingers, and the first and second fingers are interdigitated in the first direction;

a first compensation finger formed in the first conductive layer at an end of the first row of alternating first and second fingers nearest a first edge of the capacitive array, and a first connection structure connected to each of the first row of alternating first fingers, wherein the first connection structure extends in the first direction having a first length;

a second connection structure connected to each of the first row of alternating second fingers and the first compensation finger, wherein the second connection structure extends in the first direction having a second length, wherein the second length is greater than the first length;

wherein the first compensation finger is configured to have an opposite polarity as a neighboring finger on the end of the first row;

a second row of alternating third fingers and fourth fingers formed in a second conductive layer, wherein each third and fourth finger has a uniform width in the first direction and a uniform length in the second direction, the second row of alternating third and fourth fingers include a same integer number of third fingers and fourth fingers, and the third and fourth fingers are interdigitated in the first direction;

a second compensation finger formed in the second conductive layer at an end of the second row of alternating first and fourth fingers nearest a second edge of the capacitive array, wherein the second edge is on an opposite side of the capacitive array structure from the first edge; and a third connection structure connected to each of the second row of alternating third fingers, wherein the third connection structure extends in the first direction having the first length;

a fourth connection structure connected to each of the second row of alternating fourth fingers and the second compensation finger, wherein the fourth connection structure extends in the first direction having the second length;

wherein the first compensation finger is configured to have an opposite polarity as a neighboring finger on the end of the second row, wherein the first edge of the capacitive array and the second edge of the capacitive array are defined by the first row of alternating first fingers and second fingers and the second row of alternating third fingers and fourth fingers, wherein the capacitive array includes,
a first segment of the capacitive array configured to implement a most significant bit (MSB) segment, and
a second segment of the capacitive array configured to implement a least significant bit (LSB) segment, and
a scaling capacitive structure electrically connected between the LSB segment and the MSB segment;

wherein a first lateral separation formed between the LSB segment and the scaling capacitive structure;

wherein a second lateral separation formed between the scaling capacitive structure and the MSB segment; and wherein the first and second lateral separations are greater than a lateral separation between the first fingers and second fingers.

2. The capacitive array structure of claim 1, wherein the capacitive array further comprises:

a shielding structure formed between either the LSB segment or the MSB segment and the scaling capacitive structure.

3. The capacitive array structure of claim 1, wherein the first row of alternating first and second fingers implements a first plurality of unit capacitive structures in the first conductive layer, and the capacitive array further comprises a second row of alternating first and second fingers in the first conductive layer, wherein the second row is laterally adjacent to the first row, the second row of alternating first and second fingers implements a second plurality of unit capacitive structures in the first conductive layer, and each unit capacitive structure in the first conductive layer is part of a respective unit capacitor.

4. The capacitive array structure of claim 3, wherein the first plurality of unit capacitive structures are part of a first row of unit capacitors, the second plurality of unit capacitive structures are part of a second row of unit capacitors, and each of the MSB, and LSB segments includes a corresponding first row segment of the first row of unit capacitors and a corresponding second row segment of the second row of unit capacitors.

5. The capacitive array structure of claim 4, wherein the unit capacitors of the MSB segment are interconnected across the corresponding first and second row segments in a first dispersed connection pattern to form a first set of CDAC capacitors, and the unit capacitors of the LSB segment are interconnected across the corresponding first and second row segments in a second dispersed connection pattern to form a second set of CDAC capacitors.

6. The capacitive array structure of claim 5, wherein each CDAC capacitor is implemented by a respective subset of unit capacitors that includes at least one unit capacitor located in the corresponding first row segment and at least one unit capacitor located in the corresponding second row segment.

7. The capacitive array structure of claim 5, wherein each unit capacitor comprises a multi-level capacitive structure, each multi-level capacitive structure comprises a unit capacitive structure in the first conductive layer and one or more unit capacitive structures at a respective one or more conductive layers vertically adjacent to the first conductive layer, and each multi-level capacitive structure implements a uniform unit capacitance.

8. The capacitive array structure of claim 1:

wherein the capacitive array is an alternating polarity polysilicon-oxide-polysilicon (POP) capacitive array.

9. The capacitive array structure of claim 2:

wherein the shielding structure is a first shielding structure formed between the LSB segment and the scaling capacitive structure; and wherein the capacitive array further comprises, a second shielding structure formed between the MSB segment and the scaling capacitive structure.

10. The capacitive array structure of claim 1:

wherein the capacitive array further comprises, a shielding structure wrapping around at least two sides of either the LSB or MSB segments.

* * * * *